(12) United States Patent
Loucks

(10) Patent No.: US 8,155,922 B2
(45) Date of Patent: Apr. 10, 2012

(54) ELECTRICAL DEVICE COOLING EFFICIENCY MONITORING

(75) Inventor: David Glenn Loucks, Coraopolis, PA (US)

(73) Assignee: Eaton Corporation, Cleveland, OH (US)

( * ) Notice: Subject to any disclaimer, the term of this patent is extended or adjusted under 35 U.S.C. 154(b) by 279 days.

(21) Appl. No.: 12/477,965

(22) Filed: Jun. 4, 2009

(65) Prior Publication Data

US 2010/0312415 A1 Dec. 9, 2010

(51) Int. Cl.
*G05D 23/00* (2006.01)
(52) U.S. Cl. ........ 702/182; 340/635; 340/679; 340/584; 340/587; 340/507; 700/300
(58) Field of Classification Search ................... 702/182; 700/29, 300; 340/635, 679, 584, 587, 507
See application file for complete search history.

(56) References Cited

U.S. PATENT DOCUMENTS

| | | | |
|---|---|---|---|
| 2002/0180610 A1* | 12/2002 | Pedoeem et al. | 340/635 |
| 2004/0031514 A1* | 2/2004 | Bell | 136/203 |
| 2007/0038414 A1* | 2/2007 | Rasmussen et al. | 703/1 |
| 2008/0041076 A1* | 2/2008 | Tutunoglu et al. | 62/181 |
| 2009/0101313 A1* | 4/2009 | Hofmann | 165/104.19 |

* cited by examiner

*Primary Examiner* — Sujoy Kundu
*Assistant Examiner* — Haidong Zhang
(74) *Attorney, Agent, or Firm* — Kraguljac Law Gp. LLC

(57) ABSTRACT

Changes in equipment cooling performance may be detected by indirectly measuring cooling performance by way of a cooling efficiency indicator. An operating cooling efficiency indicator is calculated as a ratio between equipment electrical power consumption and a temperature differential between the equipment and an ambient temperature. The operating cooling efficiency indicator is compared to a baseline cooling efficiency indicator to detect changes in cooling performance.

20 Claims, 6 Drawing Sheets

ELECTRICAL DEVICE COOLING EFFICIENCY MONITORING

BACKGROUND

The First Law of Thermodynamics (system internal energy increases by the amount of energy added to it minus the work done by the system on its surroundings) applies to electrical equipment in that as electrical equipment consumes electrical energy, it produces heat as a waste byproduct. The magnitude of waste heat produced is related to the quantity of energy consumed by the device and the device's inherent efficiency. The temperature rise of the equipment is related to the magnitude of this waste heat and by the amount of cooling available. Cooling occurs from conduction, radiation and convection.

In the particular case of devices that rely on forced or natural convection cooling, several issues can restrict available cooling. A blocked air flow path may be caused when cabling routing within or external to equipment improperly blocks inlet, exhaust air duct(s) and/or a plenum. Drawing holders, barriers or electrical insulation sheeting mounted in equipment may block external grill covers, rodent or insect nests may block vents or air path, or insufficient clearance around vents may restrict air flow. Cooling fans may malfunction due to bearing failure, disconnected or loose wiring to a fan motor, fan power supply failure, broken, bent or missing fan blades, or fan blades that become coated with contaminants. Dirty or oily air filters may degrade cooling performance. External cooling air may be too hot due to undersized, malfunctioning or improperly set air conditioning, an external source of heat that has been placed too close to equipment, or improper routing of exhaust heat causing re-circulation into cooling inlet. External cooling air may flow too slowly due to changes in upstream ducting that cause system pressure changes, eddies, vortices, dead-spots, backflow or other air mixing problems, or cool air that leaks into environment prior to reaching electrical equipment. Air ducts may become disconnected, resulting in a degradation of cooling performance.

As can be seen from the foregoing list, many different factors may significantly impact cooling performance. Since any single or group of these issues can cause cooling problems, any of these problems can contribute to electrical equipment malfunction or accelerated degradation since overheated equipment does not operate as effectively as equipment operating at acceptable temperature limits. Traditional methods of detecting these problems include monitoring rotational velocity of fans, measuring air flow rates with damper switches or pressure sensors or heated sensors, and measuring the temperature of inlet air, exhaust air, heat sinks, or other areas of equipment.

SUMMARY

Changes in equipment cooling performance may be detected by indirectly measuring cooling performance by way of a cooling efficiency indicator. An operating cooling efficiency indicator is calculated as a ratio between equipment electrical power consumption and a temperature differential between the equipment and an ambient temperature. The operating cooling efficiency indicator is compared to a baseline cooling efficiency indicator to detect changes in cooling performance.

Accordingly, a computer-readable medium is provided that has computer-executable instructions stored thereon for performing a cooling efficiency monitoring method. The method includes receiving a baseline rate of heat transfer with respect to the monitored electrical device and converting the baseline rate of heat transfer to a baseline cooling efficiency indicator. The baseline cooling efficiency indicator includes a ratio of input electrical power to the monitored electrical device and a temperature differential across the monitored electrical device. An amount of electrical power consumed by the monitored electrical device is determined. A monitored electrical device temperature and an ambient temperature proximate the monitored electrical device are determined to compute a temperature differential between the temperature of the monitored electrical device and the ambient temperature.

An operating cooling efficiency indicator is calculated based, at least in part, on a ratio of the electrical power consumed by the monitored electrical device and the computed temperature differential. The operating cooling efficiency indicator is compared with the baseline cooling efficiency. An output that communicates results of the comparison between the operating cooling efficiency and the baseline cooling efficiency is provided. The method may be performed on a per device, per enclosure, and/or a per equipment room basis, as well as any other level of granularity that facilitates monitoring electrical device cooling performance.

A cooling efficiency monitoring system includes an ambient temperature input logic, an equipment temperature input logic, an electrical power consumption input logic, a cooling efficiency calculation logic, and a cooling efficiency comparison logic. The ambient temperature input logic receives an ambient temperature signal from an ambient temperature sensor proximate to monitored electrical device. The equipment temperature input logic receives an equipment temperature signal from an equipment temperature sensor associated with the monitored electrical device. The electrical power consumption input logic receives an amount of electrical power input to the device from an electrical power consumption sensor associated with the monitored electrical device.

The cooling efficiency calculation logic computes a temperature differential between the equipment temperature signal and the ambient temperature signal and calculates an operating cooling efficiency indicator based, at least in part, on a ratio of the electrical power input to the device and the computed temperature differential. The cooling efficiency comparison logic determines a baseline cooling efficiency, compares the operating cooling efficiency indicator with the baseline cooling efficiency, and provides an output that communicates results of the comparison between the operating cooling efficiency and the baseline cooling efficiency. The cooling efficiency system may be configured to receive temperature and power consumption signals from sensors that are integral to the devices being monitored.

In some embodiments that may be configured to be used with electrical devices that convert only a fraction of the energy to heat, electrical power consumption is determined as an energy dissipation within the device. Energy dissipation is calculated, based on the electrical power input to the device. The energy dissipation is used, along with the temperature differential to determine the cooling efficiency indicator. Energy dissipation within the device may be calculated by measuring an amount of electrical power leaving the device and determining the differential between the electrical power input to the device and the electrical power leaving the device. Energy dissipation may be calculated using a model of energy losses versus electrical power input to the device that has been determined with respect to the electrical device. The application of the model may be accomplished using a look up table, a polynomial equation, or other techniques.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

The large number of issues and causes of air flow problems means that fully instrumenting each device that may affect cooling performance can become cost prohibitive. However, since electrical or electronic equipment can malfunction due to over-temperature, detecting these problems is important. Unfortunately, for a variably loaded system, simply waiting for a high temperature limit to be reached may result in equipment damage that occurs in the time it takes to resolve the cooling problem. Thus it is desirable to detect problems before temperatures reach alarm limits. Also, for devices that are externally cooled through refrigeration, insufficient cooling due to blocked air flow can result in the refrigeration system moving to a lower temperature set point as it attempts to reduce the temperature of the protected equipment. This results in wasted energy if a better solution of fixing the airflow exists. Finally, if the temperature of the equipment does rise above previous levels, the consequences of not cooling equipment properly may result in accelerated equipment degradation and early failure.

Convective heat loss (cooling) using air as the cooling medium, may be modeled using the Navier-Stokes equations. Simplifying these equations after plugging in the properties of air and solving for imperial units of measure the following equation is obtained:

$$\dot{Q} = 1.08 V \Delta T \eta \qquad \text{Equation 1}$$

where:
  $\dot{Q}$ = rate of heat transfer in BTU/hr
  V = volumetric flow rate in CFM
  $\Delta T$ = difference between inlet and exhaust temperature (° F. or R)
  $\eta$ = efficiency of heat transfer (intentional or unintentional insulation)

Solving these equations in electrical equipment would require sensors that measure air flow, energy flow and temperature difference. The problem traditionally has been that that rate of heat transfer is difficult to measure. However, without complete instrumentation to measure volumetric airflow, sufficient information would not be available to solve these fluid dynamic heat transfer equations. Obtaining sufficient instrumentation in forced air (advective) systems, such as under floor cooling in a data center, is difficult and expensive.

Figure 1:
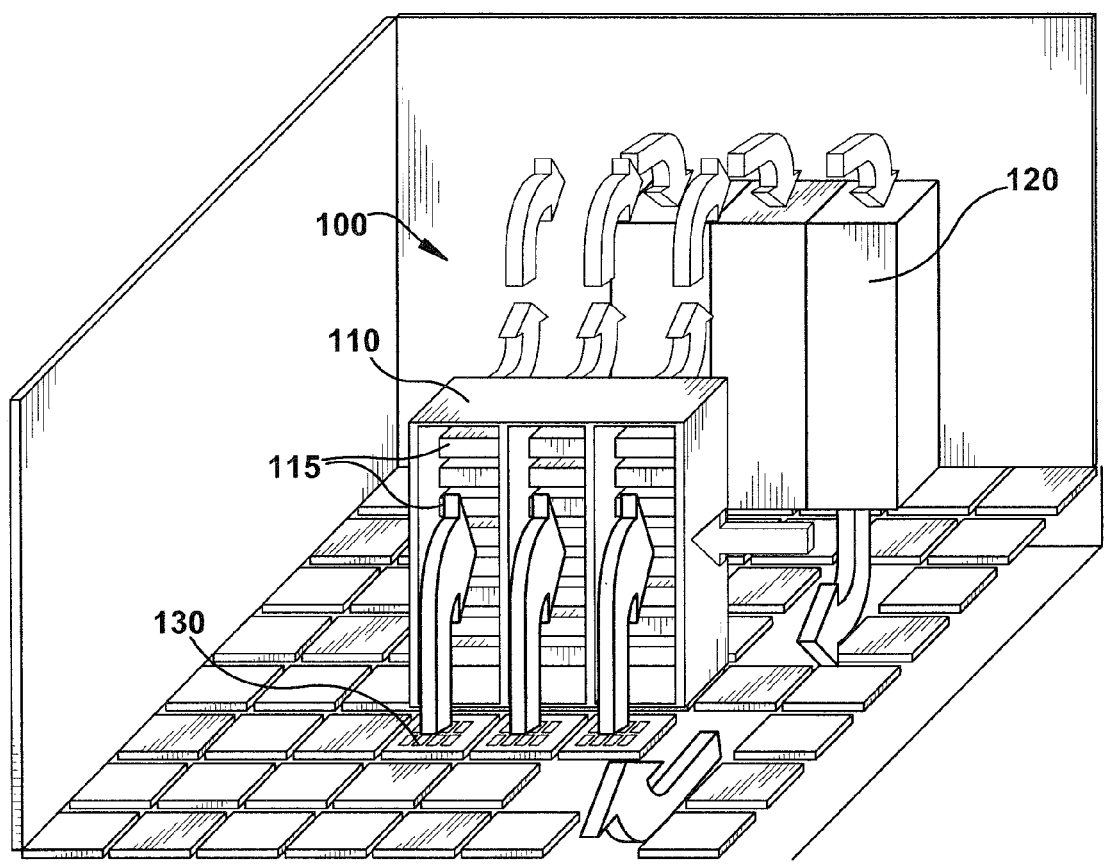
FIG. 1 is a functional block diagram of cooling operation in an equipment room.

FIG. 1 is a functional block diagram illustrating a typical data center 100 that utilizes convection cooling to cool equipment. The data center 100 houses multiple racks or enclosures 110 of IT equipment 115, such as servers, routers, switches, and circuit protection devices. A computer room air conditioner 120 intakes heated air from the room, cools it, and circulates the cooled air through the room as shown by the arrows in FIG. 1. Typically, at least part of the air from the computer room air conditioner 120 is routed below the floor of the room and is forced through holes in perforated floor tiles 130.

Most data centers require substantial cooling. In many cases, server density has outpaced the ability of the data center to cool those servers using the available cooling capacity. In this situation, there is a desire to "find" wasted cooling. Since any of the issues discussed above may cause a reduction in cooling system efficiency, locating these problems is important to those operators. Likewise, reducing energy consumption reduces expenses and frees up spare cooling capacity, which reduces the amount of capital needed to provide the required cooling, since less cooling is needed.

One common technique for optimizing forced air cooling systems is to use a computational fluid dynamic (CFD) model of the data center. The output of the CFD model solves the Navier-Stokes equations and therefore solves for airflows, temperatures, pressures and densities. In particular, since equipment manufacturers place temperature limits on their equipment, a CFD analysis can be used to estimate how present routing of air flows will, or will not, adequately cool the equipment. As IT equipment is repositioned, refrigeration is adjusted, fans or blowers and/or air ducting are modified, the CFD model is used to calculate new temperature and flow rates at various points within an installation. By optimally placing equipment with properly routed cooling air flow, the air flow required to maintain a particular temperature rise can be minimized, and an optimal cooling performance for a particular equipment layout may be determined. One drawback to using a CFD model to determine cooling performance is that any change to the equipment or cooling system typically means that another CFD model should be run. This is a real problem, since CFD models involve a certain amount of complexity and time.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

Referring back to Equation 1, the inputs of the Navier-Stokes equations include temperatures across a heated object (internal and ambient), energy consumed by the heated object, air flow across the object and efficiency of heat transfer (heat sink). Temperature monitoring is fairly straightforward. Measuring the heat input (kW), likewise, is also fairly straightforward. However, the determination of airflow rates or heat sink efficiencies is fairly involved. The cooling efficiency monitoring techniques and systems described herein detect changes from a baseline CFD model by combining easily measured values into ratios that should remain constant regardless of how the system performs. If those ratios change, that is an indication of a change in the cooling system air flow and/or performance. Use of the techniques and systems described herein may thus allow detection of cooling infrastructure changes without running an additional CFD analysis. Problems may also be detected before temperature alarms are reached, giving operators more time to locate and fix the problem.

Equation 1 can be rewritten to isolate readily known quantities (temperatures and input power) and express them in terms of the less readily determined quantities (air flow and heat sink efficiency).

$$\frac{\dot{Q}}{\Delta T} = 1.08 V \eta \qquad \text{Equation 2}$$

where:
$\dot{Q}$=rate of heat transfer in BTU/hr
V=volumetric flow rate in CFM
$\Delta T$=difference between inlet and exhaust temperature
$\eta$=efficiency of heat transfer (intentional or unintentional insulation)

As electrical equipment converts electrical energy to heat, the amount of heat produced will be related to the electrical energy consumed by the equipment. Certain equipment (such as computers) convert essentially 100% of the electrical energy into heat. Other devices such as transformers, circuit breakers, uninterruptible power supplies (UPSs) or variable frequency drives (VFDs) are more efficient consumers of electrical energy, a certain percentage of energy consumed is converted into heat. Thus a percentage value is assigned to this heat conversion rate and called it delta '$\delta$'. Since this conversion rate may vary based on percentage loading of the equipment (e.g., $I^2R$ losses from transformers) or other effects, the conversion rate variable $\delta$ is written as being a function of one or more external parameters grouped and written as the variable 'x', with the resultant conversion rate written as $\delta(x)$. Since 3412 BTUs is approximately equal to one electrical kWh, Equation 2 may be rewritten as:

$$\frac{W}{\Delta T} = 1.08 V \eta * 3412 \delta(x) = 3685 V \eta \delta(x) \qquad \text{Equation 3}$$

where:
W=rate of heat transfer in kWh
V=volumetric flow rate in CFM
$\Delta T$=difference between inlet and exhaust temperature
$\eta$=efficiency of heat transfer (intentional or unintentional insulation)
$\delta$=conversion efficiency of electrical energy into heat as a function of parameter The values on the right side of the Equation 3 are difficult to obtain, but are all substantially constant, or in the case of electrical equipment efficiency, can be modeled accurately. If changes are made in the cooling air flow rate or the efficiency of the heat sinks that transfer the kWh energy into the air, then the values on the left hand side of Equation 3 should not change. It follows that if any of these values do change, it can result in a change of the ratio of W divided by $\Delta T$. Since two variables could change at one time, (e.g. air flow volume drop while the heat sink efficiency rise), changes in either could be masked. However, the net result of these values masking one another would be that the watts-per-degree for the system would not change. In other words, the cooling performance would remain unchanged. This watts-per-degree metric can be called a "cooling efficiency indicator" and the difficult to obtain values are collapsed into a new variable $\epsilon$.

$$\frac{W}{\Delta T} = \varepsilon \qquad \text{Equation 4}$$

where:
W=rate of heat transfer in kWh
$\Delta T$=difference between inlet and exhaust temperature
$\epsilon$=epsilon, cooling efficiency indicator The cooling efficiency indicator appears from a system engineering point of view as a temperature gain parameter that predicts the effect of power input or consumption versus the long term resultant change in temperature of a device or a group of devices consuming electrical energy. Depending on the location of the output temperature sensor relative to the device, the temperature process value may experience certain transport delay. For this reason, it may be advantageous to average instantaneous calculations of the cooling efficiency indicator over time.

Many different methods for calculating such a rolling average can be used. One version calculates the mode (most common value of the cooling efficiency indicator). This method is useful when the input signals are noisy or include occasional transients (losses of input where the value drops to zero). Smoothing the signal introduces additional transport delay (time delay from when an event occurs and when it is detected), so there is a trade-off between sampling frequency, amount of smoothing and speed of response. Greater levels of smoothing may allow for the detection of smaller changes in cooling performance without incurring a high number of nuisance alarms, but may also slow the response time to detect those changes. The designer of the system can trade-off smoothing (gain), cost (sampling rate and sensor accuracy) and speed of response by choosing the parameters appropriately.

Figure 2:
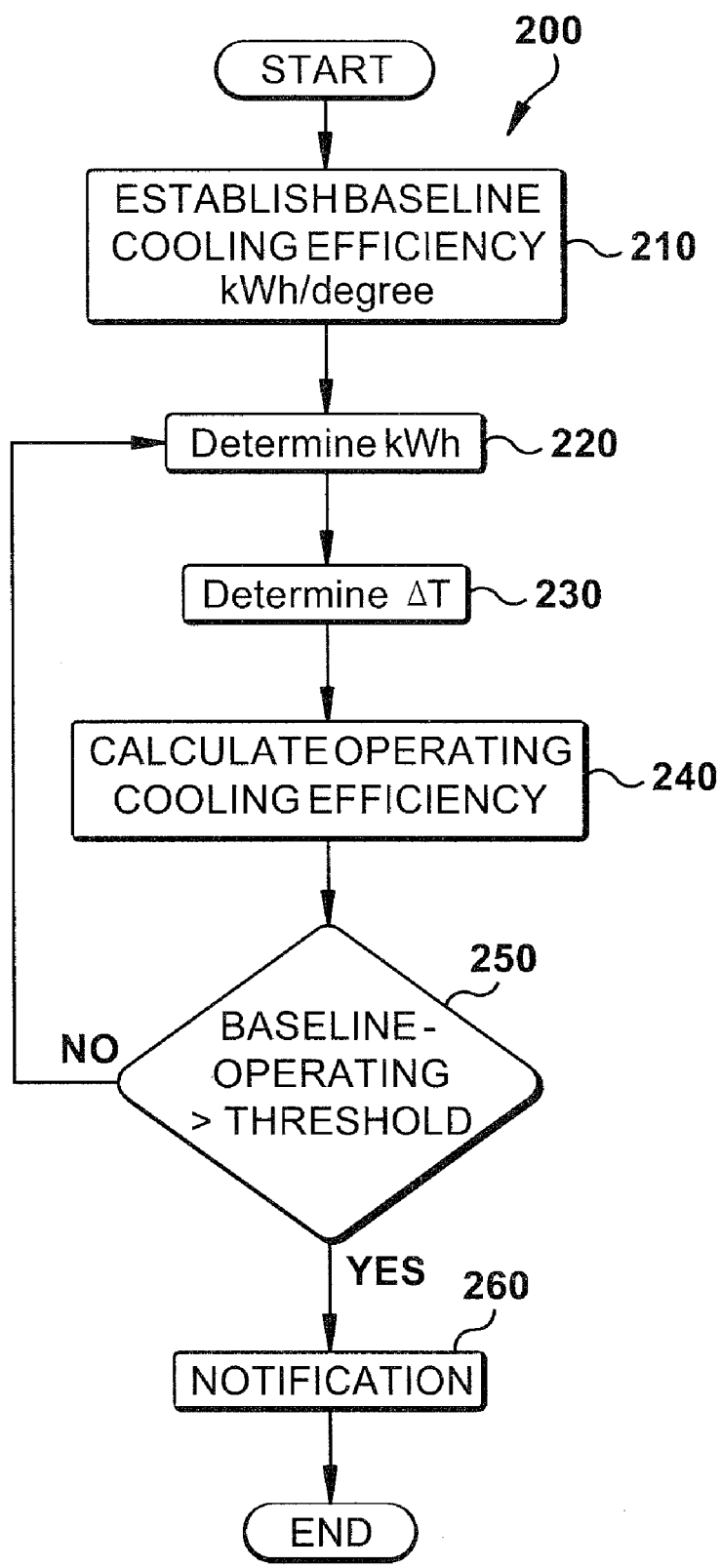
FIG. 2 is a flow diagram outlining an example embodiment of a method of monitoring cooling efficiency.

FIG. 2 is a flow diagram that illustrates an example embodiment of a method 200 that monitors cooling efficiency with respect to electrical equipment. At 210, a baseline cooling efficiency is established in kWh/degree, or other analogous units. The baseline cooling efficiency may be established by receiving a baseline rate of heat transfer with respect to the monitored electrical device and converting the baseline rate of heat transfer to a baseline cooling efficiency indicator that is ratio of input electrical power to the monitored electrical device and a temperature differential across the monitored electrical device. At 220 an amount of electrical power consumed by the monitored electrical device is determined. At 230 a monitored electrical device temperature and an ambient temperature proximate the monitored electrical device are determined to compute a temperature differential between the temperature of the monitored electrical device and the ambient temperature.

At 240 an operating cooling efficiency indicator is calculated based, at least in part, on a ratio of the electrical power consumed by the monitored electrical device and the computed temperature differential. At 250 the operating cooling efficiency indicator is compared with the baseline cooling efficiency and at 260 if the difference in cooling efficiencies exceeds a threshold, a notification that communicates results of the comparison between the operating cooling efficiency and the baseline cooling efficiency is provided.

In some embodiments, the baseline heat transfer is converted to a baseline cooling efficiency indicator by assigning a heat conversion rate to the monitored electrical device. The heat conversion rate is selected based, at least in part, an equipment classification of the monitored electrical device. For example, computer devices may be assigned a heat conversion rate of 1 while more efficient (in terms of electricity to heat generation) devices such as circuit breakers may be assigned a rate of less than one.

By definition, high efficiency equipment, such as circuit breakers, have correspondingly low losses as compared to their power input. For such devices, a model may be the preferred method of determining the heat conversion rate $\delta(x)$ as compared to measuring the difference between the input and output power for a given device. This is because the difference between input and output power could be smaller than the inherent resolution of cost-efficient energy metering devices. Also, even if the available metering devices are lower cost, measuring input and output power would likely involve additional sensors with a commensurate increase in complexity and cost. However, if no sufficiently accurate model exists for losses versus loading, even low accuracy energy meters could be employed to provide a more accurate measurement of small differential losses using known oversampling techniques.

While absolute measurement of the cooling efficiency indicator may be less important than the ability to detect changes in the cooling efficiency indicator over time, determining an accurate baseline cooling efficiency indicator is useful to understand how well the equipment is operating at the beginning of the monitoring process. The cooling efficiency indicator is determined by trending the cooling efficiency of the device over time. However, if the starting point for the creation the baseline cooling efficiency indicator is on equipment in unknown and perhaps poor operating condition, the equipment may already be experiencing cooling problems—yielding a less reliable baseline cooling efficiency indicator. Hence, establishing the baseline cooling efficiency indicator in conjunction with the performance of a CFD model may provide a more beneficial baseline cooling efficiency indicator for high efficiency (in terms of electricity to heat generation) electrical devices.

To augment the CFD model, it is useful to have accurately metered losses within the device. For linear electrical equipment operating near full load, these losses tend to be primarily resistive and are therefore proportional to the square of the current ($I^2R$). However, many other losses such as eddy current and hysteresis losses are frequently observed, especially in devices with magnetic elements (including structure surrounding the equipment). In non-linear (semiconductor, iron-core) devices, losses related to switching frequency and device characteristics are prevalent. Those other losses are affected not only by the magnitude of current but also by the frequency components contained within the current. Since real-world equipment operates in systems with current harmonics, accurate loss models should include the percentage of frequency current components within the energy passing through the device. In such cases, the external parameter x in the calculation of a device's heat conversion rate $\delta(x)$ is a function of both loading and frequency components, or $x=f(a,b)$, where 'a' is a function related to energy magnitude and 'b' is a function of changes in current over time (i.e., frequency harmonics).

In some embodiments the baseline heat transfer is converted to a baseline cooling efficiency indicator by converting heat transfer units into electrical power consumption units and solving the Navier-Stokes equation to isolate a ratio of the electrical power consumption and a temperature differential with respect to a monitored electrical device temperature and an ambient temperature. The baseline heat transfer may be computed using CFD analysis. In some embodiments, a rolling average of the operating cooling efficiency indicator is computed and the computed rolling average is compared with the baseline cooling efficiency indicator.

The method 200 may be embodied as a set of computer-executable instructions stored on a computer-readable medium. For example, the computer-readable medium may be configured to be portable and capable of being used to transfer or otherwise provide the set of instructions to a device that is to monitor cooling efficiency. Alternatively, the computer-readable medium may be resident within a device that is to monitor cooling efficiency (i.e., ASIC). Of course other configurations of computer-readable medium, as defined herein, may be used in practice the method 200.

"Computer-readable medium", as used herein, refers to a medium that stores signals, instructions and/or data. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Logic", as used herein with respect to apparatus, includes but is not limited to hardware, firmware, a method encoded as executable steps on a computer-readable medium, and/or combinations thereof to perform a function(s) or an action(s), and/or to cause a function or action from another logic, method, and/or system. Logic may be encoded in one or more tangible media that stores computer executable instructions that if executed by a machine (e.g., ASIC) cause the machine to perform the encoded method. Logic may include a software controlled microprocessor, discrete logic (e.g., application specific integrated circuit (ASIC)), an analog circuit, a digital circuit, a programmed logic device, a memory device containing instructions, and so on. Logic may include a gate(s), a combination of gates, other circuit components, and so on. Where multiple logical units are described, it may be possible in some examples to incorporate the multiple logical units into one physical logic. Similarly, where a single logic is described, it may be possible in some examples to distribute that single logic between multiple physical units.

Figure 3:
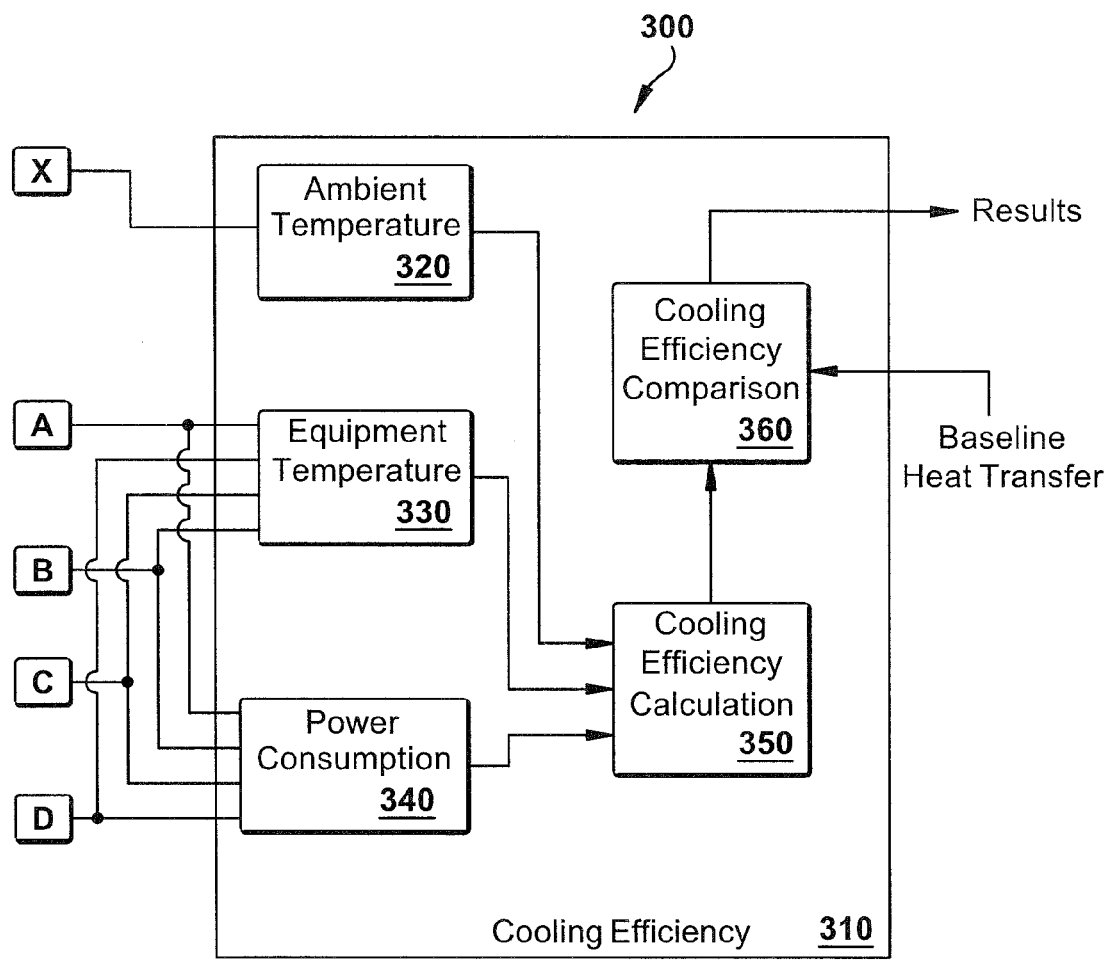
FIG. 3 is a functional block diagram of an example embodiment of a cooling efficiency monitoring system.

FIG. 3 illustrates a functional block diagram of a cooling efficiency monitoring system 310 that monitors the cooling efficiency of numerous electrical devices A-D in a data center 300. The cooling efficiency monitoring system includes an ambient temperature input logic 320, an equipment temperature input logic 330, an electrical power consumption logic 340, a cooling efficiency calculation logic 350, and a cooling efficiency comparison logic 360. The ambient temperature input logic receives an ambient temperature signal from an ambient temperature sensor X that is proximate to monitored electrical devices A-D. The equipment temperature input logic receives an equipment temperature signal from an equipment temperature sensor (not shown) associated with the monitored equipment. Many electrical devices self monitor temperature and may be capable of outputting their temperature to the equipment temperature input logic 330.

The electrical power consumption input logic receives an amount of electrical power consumption from an electrical power consumption sensor (not shown) associated with the monitored equipment. The cooling efficiency calculation logic 350 computes a temperature differential between the equipment temperature and the ambient temperature. The cooling efficiency logic also calculates an operating cooling efficiency indicator based, at least in part, on a ratio of the electrical power consumption and the computed temperature differential. The cooling efficiency comparison logic 360 determines a baseline cooling efficiency and compares the operating cooling efficiency indicator with the baseline cooling efficiency. The cooling efficiency comparison logic may, for example, receive a baseline heat transfer from a CFD analysis, or in other cases, a baseline cooling efficiency may be computed by another device and then transmitted to the cooling efficiency comparison logic 360. The cooling efficiency comparison logic 360 communicates results of the comparison between the operating cooling efficiency and the baseline cooling efficiency. In some embodiments, the cooling efficiency comparison logic 360 includes an alert mechanism that provides an alert when a difference between the operating cooling efficiency and the baseline cooling efficiency exceeds a predetermined threshold.

The cooling efficiency techniques and systems described herein may be used on any device that consumes electrical energy and exhausts waste heat. Examples of such devices include: circuit breakers (open or enclosed), fuses and fused switches, variable or adjustable frequency drives, reduced voltage soft starters, uninterruptible power supplies, transformers, electrical assemblies and structures including switchboards, switchgear and motor control centers and components such as switched mode power supplies providing power to servers, networking equipment, programmable logic controllers, storage devices, and telephone systems. The cooling efficiency techniques and systems described herein may be also be used to monitor groups or systems of electrical devices such as data centers, wiring closets, and electrical rooms. A change in the cooling efficiency indicator may be used to detect changes to the cooling system performance of any of these devices or systems long before over-temperature limits are reached.

Figure 4:
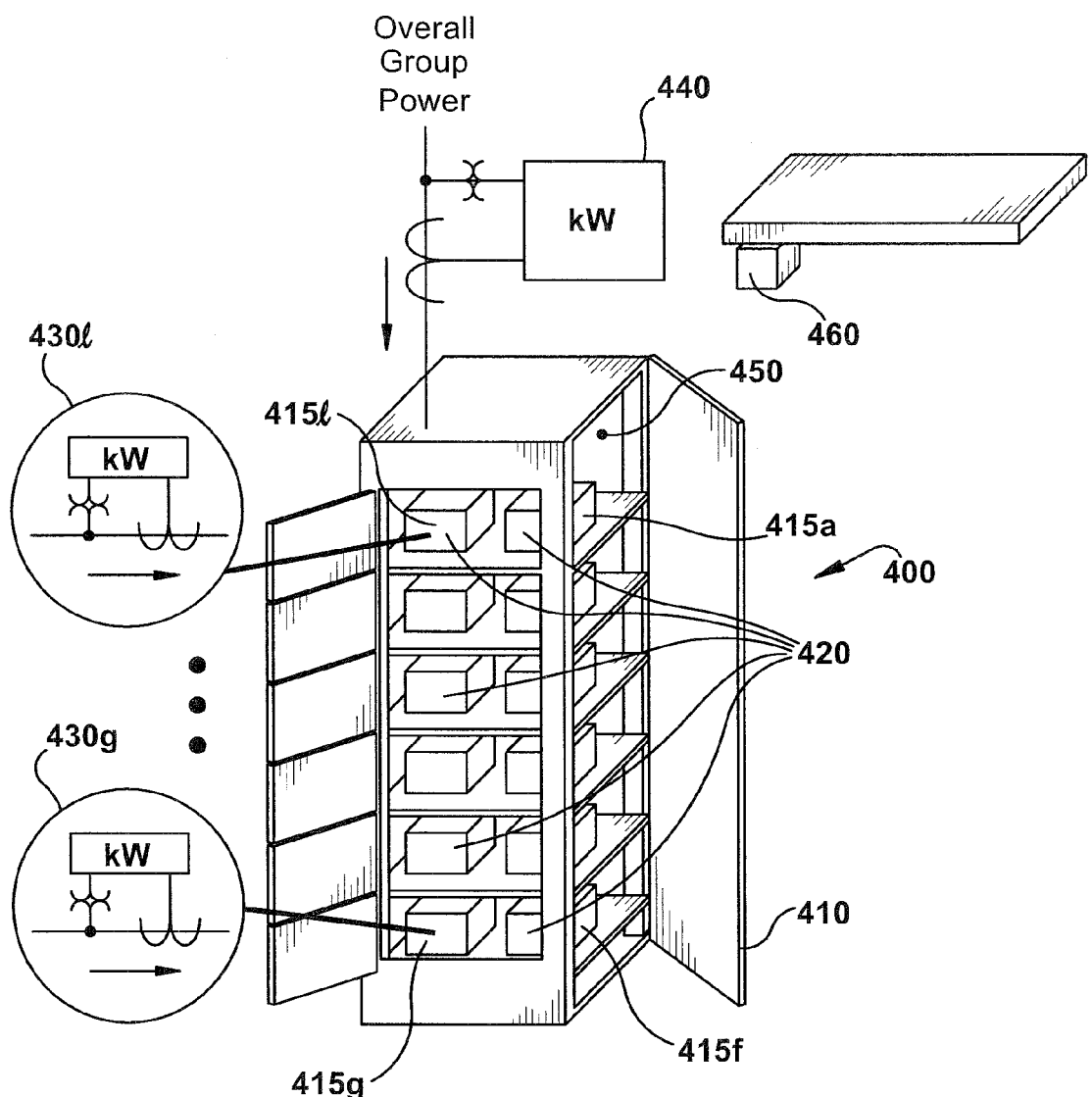
FIG. 4 is a functional block diagram of cooling efficiency monitoring system installed on an equipment enclosure.
Figure 5:
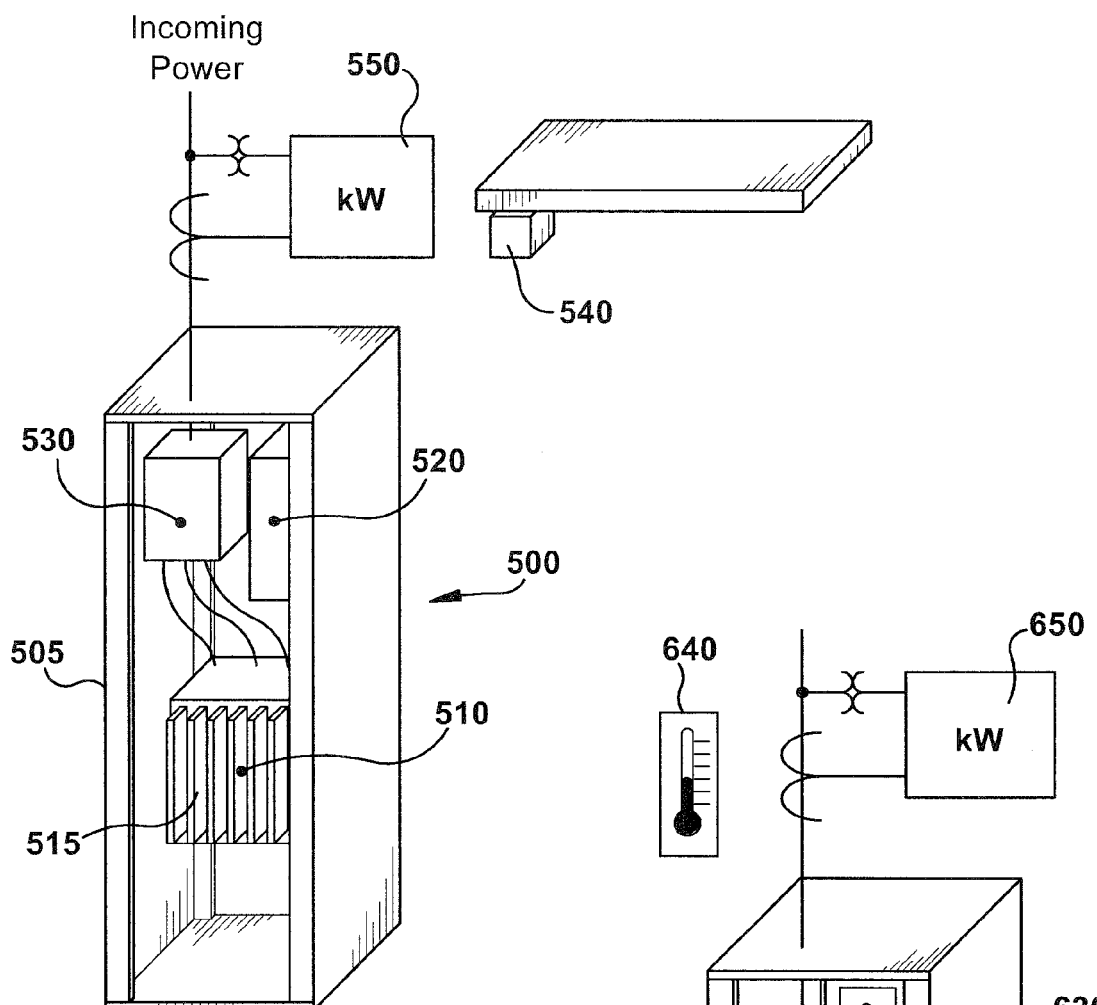
FIG. 5 is a functional block diagram of cooling efficiency monitoring system installed on an equipment enclosure.
Figure 6:
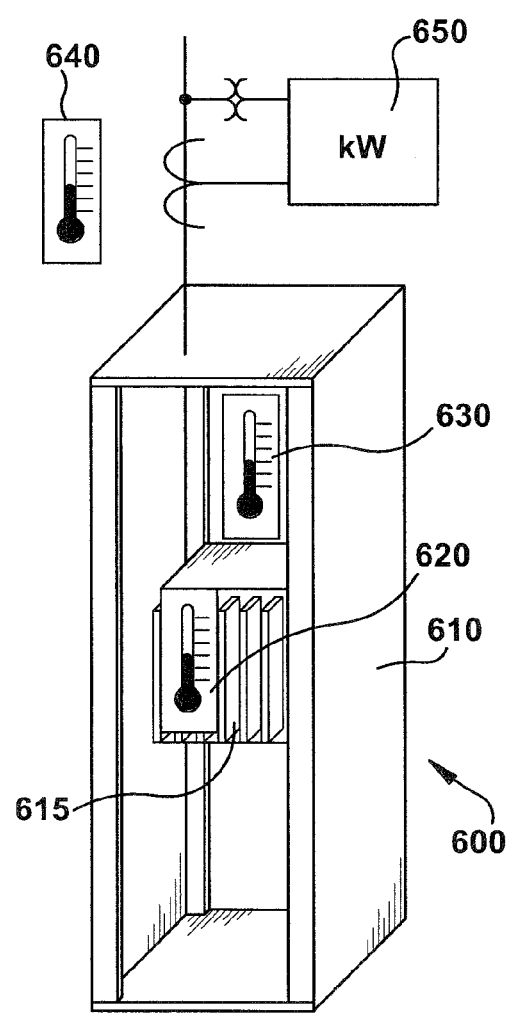
FIG. 6 is a functional block diagram of cooling efficiency monitoring system installed on an equipment enclosure.

FIGS. 4-6 illustrate various examples of how sensors could be installed in typical enclosures containing a variety of heat producing electrical devices.

FIG. 4 illustrates a cooling efficiency monitoring system 400 as used with an enclosure 410. The enclosure 410 houses several electrical devices 415a-415I, such as, for example, motor controllers or servers. Temperature sensors 420 are installed (or already present within) each electrical device 415. An enclosure temperature sensor 450 measures the temperature within the enclosure 410. An ambient temperature sensor 460 measures the temperature outside of the enclosure. Electrical power consumption sensors 430a-430I are installed for each electrical device 415 to monitor the power consumption of each device. An overall group power meter 440, measures the electrical power input to the entire enclosure. Cooling efficiency indicators may be computed with respect to a variety of components and groups of components. Using the components shown in FIG. 4, a cooling efficiency indicator may be calculated with respect to each electrical device using the dedicated power sensors 430a-430I, and using a differential between the temperature sensors 415a-415I for each device and the enclosure temperature sensor 450.

FIG. 5 illustrates a cooling efficiency monitoring system 500 that includes a single power consumption sensor 550 that monitors power input to an enclosure 505. Multiple temperature sensors are utilized, including a breaker trip unit temperature sensor 530, a power electronics heat sink temperature sensor 510, and a microprocessor temperature sensor 520 that are installed within the enclosure, as well as an ambient temperature sensor 540. Each temperature sensor within the enclosure is matched with an ambient sensor external to the enclosure and this, along with the kW input to the enclosure can be used to calculate the cooling efficiency indicator. For an enhanced calculation, each separate temperature sensor can be used to calculate a separate cooling efficiency indicator. The redundancy of the temperature sensors provides insights into how the equipment operates, specifically transport delay and detection of sensor calibration error.

FIG. 6 is a simplified version of a typical cooling efficiency monitoring system 600 that monitors the cooling efficiency for an enclosure 610. One electrical power consumption sensor 650 and three temperatures sensors are used: an ambient (external to the enclosure) temperature sensor 640, an internal enclosure temperature (measures heat produced by groups of devices) sensor 630, and a device temperature sensor 620. Using these values, three cooling efficiency indicators may be calculated and trended: a cooling efficiency indicator for the overall enclosure versus ambient, a cooling efficiency indicator for each device versus ambient, and a cooling efficiency for each device versus the enclosure.

While three specific systems are illustrated in FIGS. 4-6, any number of configurations of temperature and power consumption sensors may be utilized for cooling efficiency monitoring. Existing sensors may be leveraged with minimal cost and external sensors added as desired. By continuously solving for the cooling efficiency indicator, the linear simultaneous equations (LSEs) describing the heat transfer within a device or group of device are, in effect, being solved. Redundancy of sensors permits the calculation of several different LSEs that model the same system but use different inputs. Deviations between the computed changes in trended cooling efficiency indicators for that device, assembly, or structure between each LSE indicates possible sensor calibration drift or other sensor malfunction. Agreement between LSE calculated changes (reductions) in cooling efficiency can now be identified and fixed, freeing up spare cooling capacity, reducing energy costs, possibly increasing equipment life (if the result is that the equipment operates at lower temperature) and reducing the need for capital expenditures since the additional cooling can be used to cool more equipment.

Figure 7:
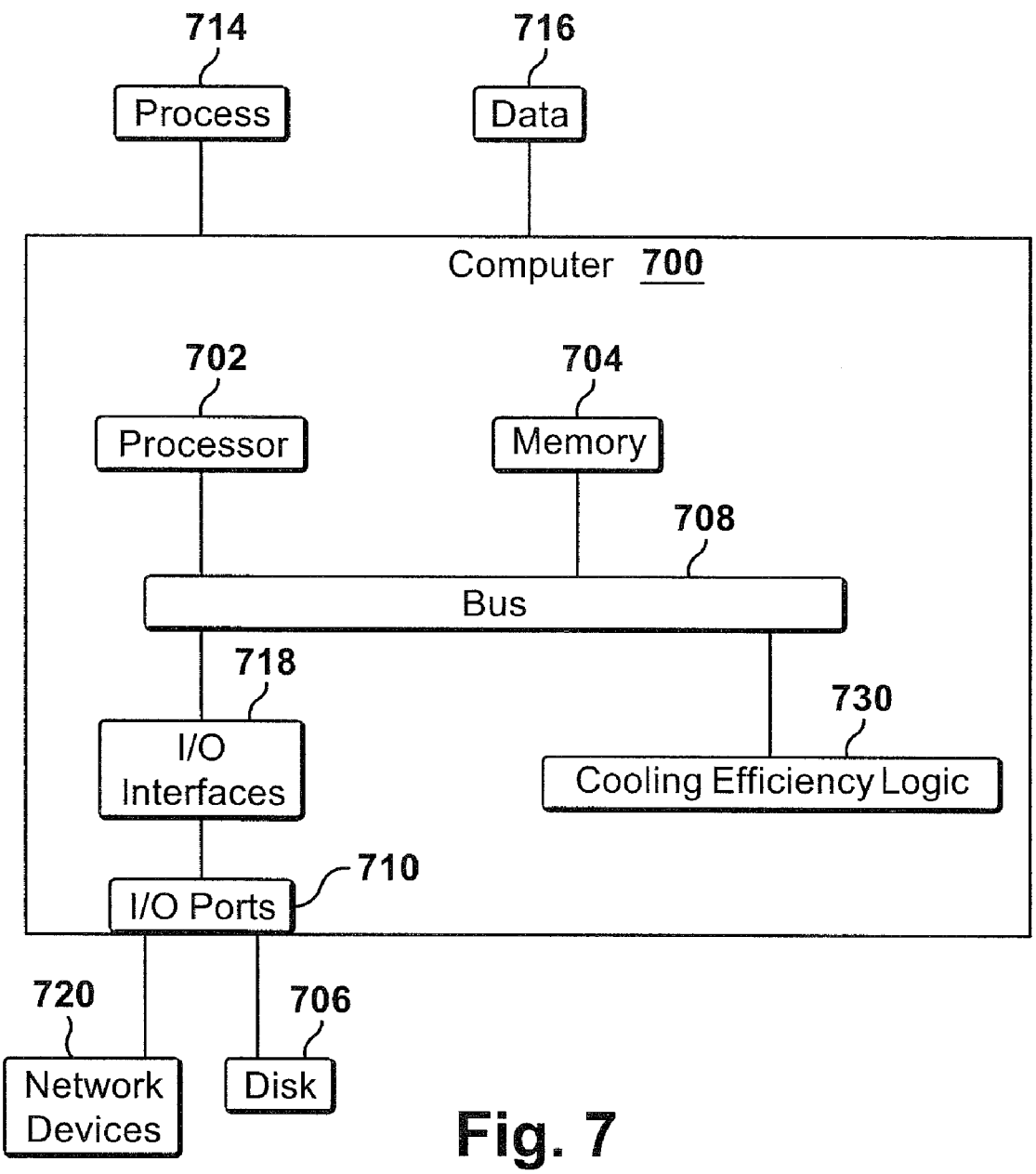
FIG. 7 illustrates an example computing environment in which example systems and methods, and equivalents, may operate.

FIG. 7 illustrates an example computing device in which example systems and methods described herein, and equivalents, may operate. The example computing device may be a computer 700, such as, for example, a NAT device, that includes a processor 702, a memory 704, and input/output ports 710 operably connected by a bus 708. In one example, the computer 700 may include a cooling efficiency logic 730 to calculate a cooling efficiency indicator. The cooling efficiency logic 730 may be located in an ASIC. In different examples, the cooling efficiency logic 730 may be implemented in hardware, a method encoded on a tangible medium, firmware, and/or combinations thereof. While the cooling efficiency logic 730 is illustrated as a hardware component attached to the bus 708, it is to be appreciated that in one example, the cooling efficiency logic 730 could be implemented in the processor 702.

Thus, cooling efficiency logic 730 may provide (e.g., hardware, firmware) means for determining an amount of electrical power consumed by a monitored electrical device. The means may be implemented, for example, as an ASIC programmed to receive data from electrical devices and sensors.

Cooling efficiency logic 730 may provide (e.g., hardware, firmware) means for determining a monitored electrical device temperature and an ambient temperature proximate the monitored electrical device to compute a temperature differential between the temperature of the monitored electrical device and the ambient temperature. The means may be implemented, for example, as an ASIC programmed to receive data from electrical devices and sensors.

Cooling efficiency logic 730 may provide (e.g., hardware, firmware) means for calculating an operating cooling efficiency indicator based, at least in part, on a ratio of the electrical power consumed by the monitored electrical device and the computed temperature differential. The means may be implemented, for example, as an ASIC programmed to manipulate data received from electrical devices and sensors.

Cooling efficiency logic 730 may also provide (e.g., hardware, firmware) means for comparing the operating cooling efficiency indicator with a baseline cooling efficiency. Cooling efficiency logic 730 may also provide (e.g., hardware, firmware) means for providing an output that communicates results of the comparison between the operating cooling efficiency and the baseline cooling efficiency.

Cooling efficiency logic 730 may provide (e.g., hardware, firmware) means for receiving a baseline rate of heat transfer with respect to the monitored electrical device and means for converting the baseline rate of heat transfer to the baseline cooling efficiency indicator comprising a ratio of input electrical power to the monitored electrical device and a temperature differential across the monitored electrical device. The means may be implemented, for example, as an ASIC programmed to manipulate data received from electrical devices and sensors.

Generally describing an example configuration of the computer 700, the processor 702 may be a variety of various processors including dual microprocessor and other multiprocessor architectures. A memory 704 may include volatile memory and/or non-volatile memory. Non-volatile memory may include, for example, ROM, programmable ROM (PROM), and so on. Volatile memory may include, for example, RAM, static RAM (SRAM), dynamic RAM (DRAM), and so on. While a computer 700 is described, the cooling efficiency logic 730 may appear in a networking device.

A disk 706 may be operably connected to the computer 700 via, for example, an input/output interface (e.g., card, device) 718 and an input/output port 710. The disk 706 may be, for example, a magnetic disk drive, a solid state disk drive, a floppy disk drive, a tape drive, a Zip drive, a flash memory card, a memory stick, and so on. Furthermore, the disk 706 may be a CD-ROM drive, a CD recordable (CD-R) drive, a CD rewriteable (CD-RW) drive, a digital versatile disk and/or digital video disk ROM (DVD ROM), and so on. The memory 704 can store a process 714 and/or data 716, for example. The disk 706 and/or the memory 704 can store an operating system that controls and allocates resources of the computer 700.

The bus 708 may be a single internal bus interconnect architecture and/or other bus or mesh architectures. While a single bus is illustrated, it is to be appreciated that the computer 700 may communicate with various devices, logics, and peripherals using other busses (e.g., peripheral component interconnect express (PCIE), 1394, universal serial bus (USB), Ethernet). The bus 708 can be types including, for example, a memory bus, a memory controller, a peripheral bus, an external bus, a crossbar switch, and/or a local bus.

The computer 700 may interact with input/output devices via the I/O interfaces 718 and the input/output ports 710. Input/output devices may be, for example, a keyboard, a microphone, a pointing and selection device, cameras, video cards, displays, the disk 706, the network devices 720, and so on. The input/output ports 710 may include, for example, serial ports, parallel ports, and USB ports.

The computer 700 can operate in a network environment and thus may be connected to the network devices 720 via the I/O interfaces 718, and/or the I/O ports 710. Through the network devices 720, the computer 700 may interact with a network. Through the network, the computer 700 may be logically connected to remote computers. Networks with which the computer 700 may interact include, but are not limited to, a LAN, a WAN, and other networks.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

What is claimed is:

1. A non-transitory computer-readable medium having computer-executable instructions stored thereon for performing a cooling efficiency monitoring method, the method comprising:
   receiving a baseline cooling efficiency indicator comprising a ratio of input electrical power to a monitored electrical device and a temperature differential across the monitored electrical device;
   determining the amount of electrical power input to the monitored electrical device;
   determining a monitored electrical device temperature and an ambient temperature proximate the monitored electrical device to compute a temperature differential between the temperature of the monitored electrical device and the ambient temperature;
   calculating an operating cooling efficiency indicator based, at least in part, on a ratio of the electrical power input to the monitored electrical device and the computed temperature differential;
   comparing the operating cooling efficiency indicator with the baseline cooling efficiency; and
   providing an output that communicates results of the comparison between the operating cooling efficiency and the baseline cooling efficiency.

2. The non-transitory computer-readable medium of claim 1 further comprising receiving a baseline rate of heat transfer with respect to a monitored electrical device and converting the baseline rate of heat transfer to the baseline cooling efficiency indicator.

3. The non-transitory computer-readable medium of claim 2 where the converting is performed by converting heat transfer units into electrical power consumption units and solving the Navier-Stokes equation to isolate a ratio of the electrical power input to the monitored electrical device and a temperature differential with respect to a monitored electrical device temperature and an ambient temperature, such that baseline cooling efficiency indicator comprises the ratio of the electrical power input to the monitored electrical device and the temperature differential.

4. The non-transitory computer-readable medium of claim 1 where the comparing is performed by computing a rolling average of the operating cooling efficiency indicator and comparing the computed rolling average with the baseline cooling efficiency indicator.

5. The non-transitory computer-readable medium of claim 1 where the determining of electrical power input to the monitored electrical device is performed by determining an amount of electrical power flowing into an equipment enclosure that houses multiple electrical devices, further where the determining of the monitored electrical device temperature is performed by determining a temperature within the enclosure and the determining of an ambient temperature is performed by determining a temperature outside the enclosure.

6. The non-transitory computer-readable medium of claim 1 where the determining of electrical power input to the monitored electrical device is performed by determining electrical power flowing into a monitored electrical device within an equipment enclosure that houses multiple electrical devices.

7. The non-transitory computer-readable medium of claim 6 where the determining of an ambient temperature is performed by determining a temperature outside of an enclosure that houses the monitored electrical device.

8. The non-transitory computer-readable medium of claim 6 where the determining of an ambient temperature is performed by determining a temperature inside an enclosure that houses the monitored electrical device.

9. The non-transitory computer-readable medium of claim 1 where the determining of the monitored electrical device temperature is performed by receiving signals indicative of the monitored electrical device temperature from a temperature sensor that is integral to the monitored electrical device.

10. The non-transitory computer-readable medium of claim 1 comprising determining a heat conversion rate of the monitored electrical device based, at least in part, on the electrical power input to the monitored electrical device and where the cooling efficiency indicator is based, at least in part, on a ratio of the power input to the monitored electrical device as scaled by the heat conversion rate.

11. The non-transitory computer-readable medium of claim 10 where the determining of the heat conversion rate is performed by measuring an electrical power output by the monitored electrical device and determining a differential between the electrical power input to the monitored electrical device and the electrical power output by the monitored electrical device.

12. The non-transitory computer-readable medium of claim 10 where the determining of the heat conversion rate is performed by solving a heat conversion model that expresses heat conversion rates for the monitored electrical device as a function of the electrical power input to the monitored electrical device.

13. A cooling efficiency monitoring system comprising:
an ambient temperature input logic to receive an ambient temperature signal from an ambient temperature sensor proximate to a monitored electrical device;
an equipment temperature input logic to receive an equipment temperature signal from an electrical device temperature sensor associated with the monitored electrical device;
an electrical power consumption input logic to receive an electrical power consumption from an electrical power consumption sensor associated with the monitored electrical device;
a cooling efficiency calculation logic to compute a temperature differential between the equipment temperature and the ambient temperature and calculate an operating cooling efficiency indicator based, at least in part, on a ratio of the electrical power consumption and the computed temperature differential; and
a cooling efficiency comparison logic to determine a baseline cooling efficiency, compare the operating cooling efficiency indicator with the baseline cooling efficiency, and provide an output that communicates results of the comparison between the operating cooling efficiency and the baseline cooling efficiency.

14. The cooling efficiency monitoring system of claim 13 where the cooling efficiency comparison logic computes a rolling average of the operating cooling efficiency and compares the computed rolling average with the baseline cooling efficiency.

15. The cooling efficiency monitoring system of claim 13 where the cooling efficiency comparison logic determines the baseline cooling efficiency by converting heat transfer units of a baseline heat transfer for the monitored electrical device into electrical power consumption units and solving the Navier-Stokes equation to isolate a ratio of the electrical power consumption and a temperature differential with respect to the equipment temperature and the ambient temperature, such that baseline cooling efficiency comprises a ratio of the input electrical power consumption and the temperature differential.

16. The cooling efficiency monitoring system of claim 13 where the cooling efficiency comparison logic comprises an alert mechanism that provides an alert when a difference between the operating cooling efficiency and the baseline cooling efficiency exceeds a predetermined threshold.

17. The cooling efficiency monitoring system of claim 13 where the cooling efficiency calculation logic determines a heat conversion rate for the monitored electrical device by solving a heat conversion model that expresses heat conversion rates for the monitored electrical device as a function of the electrical power consumption of the monitored electrical device and where the cooling efficiency calculation logic calculates the cooling efficiency indicator based, at least in part, on a ratio the electrical power consumption of the device scaled by the heat conversion rate and the computed temperature differential.

18. A cooling efficiency monitoring system comprising:
means for determining an amount of electrical power consumed by a monitored electrical device;
means for determining a monitored electrical device temperature and an ambient temperature proximate the monitored electrical device to compute a temperature differential between the temperature of the monitored electrical device and the ambient temperature;
means for calculating an operating cooling efficiency indicator based, at least in part, on a ratio of the electrical power consumed by the monitored electrical device and the computed temperature differential;

means for comparing the operating cooling efficiency indicator with a baseline cooling efficiency; and means for providing an output that communicates results of the comparison between the operating cooling efficiency and the baseline cooling efficiency.

19. The cooling efficiency monitoring system of claim 18 further comprising:

means for receiving a baseline rate of heat transfer with respect to the monitored electrical device; and means for converting the baseline rate of heat transfer to the baseline cooling efficiency indicator comprising a ratio of input electrical power to the monitored electrical device and a temperature differential across the monitored electrical device.

20. The cooling efficiency monitoring system of claim 18 where the means for calculating an operating cooling efficiency indicator includes means for solving a heat conversion model that expresses heat conversion rates for the monitored electrical device as a function of the electrical power being consumed by the monitored electrical device, and where the means for calculating calculates the cooling efficiency by scaling the amount electrical power consumed by the monitored electrical device by the heat conversion rate.

* * * * *